United States Patent
Hsu et al.

(10) Patent No.: US 8,349,630 B1
(45) Date of Patent: Jan. 8, 2013

(54) METHODS FOR MANUFACTURING THIN FILM TRANSISTOR ARRAY SUBSTRATE AND DISPLAY PANEL

(75) Inventors: Jehao Hsu, Shenzhen (CN); Jingfeng Xue, Shenzhen (CN); Xiaohui Yao, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 13/318,351

(22) PCT Filed: Aug. 26, 2011

(86) PCT No.: PCT/PC2011/078975
§ 371 (c)(1),
(2), (4) Date: Oct. 31, 2011

(30) Foreign Application Priority Data

Jun. 28, 2011 (CN) .......................... 2011 1 0176756

(51) Int. Cl.
*H01L 21/00* (2006.01)
(52) U.S. Cl. .............. 438/30; 438/22; 438/34; 438/671; 438/E21.536; 349/44; 349/46

(58) Field of Classification Search .............. 438/30–34, 438/22, 149, 158, 299, 551–558, 671–672, 438/717, 736; 394/44, 46; 345/92
See application file for complete search history.

(56) References Cited

U.S. PATENT DOCUMENTS

2008/0057607 A1* 3/2008 Oke et al. .................... 438/30

* cited by examiner

*Primary Examiner* — Dung A. Le

(57) ABSTRACT

The present invention provides methods for manufacturing a thin film transistor (TFT) array substrate and a display panel. The method for manufacturing the TFT array substrate comprises the following steps: forming a plurality of gate electrodes, a gate insulating layer, a semiconductor layer, an ohmic contact layer, an electrode layer and a photo-resist layer on a transparent substrate in sequence; using a multi tone mask to pattern the photo-resist layer; forming a plurality of source electrodes and a plurality of drain electrodes at both sides of the channels, respectively; heating the photo-resist layer; etching the semiconductor layer; removing the photo-resist layer; forming a passivation layer on the channels, the source electrodes and the drain electrodes; and forming a pixel electrode layer on the passivation layer. The present invention can reduce an amount of the required masks in the fabrication process, and only one wet etching is required to etch the metal material on the TFT array substrate.

19 Claims, 4 Drawing Sheets

METHODS FOR MANUFACTURING THIN FILM TRANSISTOR ARRAY SUBSTRATE AND DISPLAY PANEL

FIELD OF THE INVENTION

The present invention relates to a field of a liquid crystal display technology, and more particularly to methods for manufacturing a thin film transistor (TFT) array substrate and a display panel.

BACKGROUND OF THE INVENTION

Liquid crystal displays (LCDs) have been widely applied in electrical products. Currently, most of LCDs are backlight type LCDs which comprise a liquid crystal panel and a backlight module. In general, the LCD panel may include a color filter (CF) substrate and a TFT array substrate. The CF substrate includes a plurality of color filters and a common electrode. The TFT array substrate includes a plurality of parallel scanning lines, a plurality of parallel data lines, a plurality of TFTs and a plurality of pixel electrodes. The scanning lines are respectively vertical to the data lines. Each adjacent two of the scanning lines and each adjacent two of the data lines intersect to define a pixel area.

In a process for fabricating the TFT array substrate, a plurality of masks are required to perform photolithography processes. However, the masks are very expensive. The more the number of the masks is, the higher the cost for fabricating the TFT is. Furthermore, more masks will result in longer process time and more complicated process. Besides, in the photolithography process, several steps of wet etching are required, hence deteriorating metal lines of the TFT array substrate As a result, it is necessary to provide methods for manufacturing a TFT array substrate and a display panel to solve the problems existing in the conventional technologies, as described above.

SUMMARY OF THE INVENTION

A primary object of the present invention is to provide a method for manufacturing a thin film transistor array substrate, and the method comprising the following steps: forming a plurality of gate electrodes on a transparent substrate; forming a gate insulating layer, a semiconductor layer, an ohmic contact layer, an electrode layer and a photo-resist layer on the transparent substrate and the gate electrodes in sequence; using a multi tone mask to pattern the photo-resist layer, so as to allow the photo-resist layer to have different thicknesses and channels, wherein the channels are formed above the gate electrodes; etching the semiconductor layer, the ohmic contact layer and the electrode layer, so as to remove a portion of the semiconductor layer, a portion of the ohmic contact layer and a portion of the electrode layer, and to form a plurality of source electrodes and a plurality of drain electrodes at both sides of the channels, respectively; heating the photo-resist layer, so as to allow a portion of the photo-resist layer to reflow into the channels and to shelter the channels; etching the semiconductor layer, so as to remove a portion of the semiconductor layer; removing the photo-resist layer; forming a passivation layer on the channels, the source electrodes and the drain electrodes; and forming a pixel electrode layer on the passivation layer, wherein the pixel electrode layer is electrically connected to the drain electrodes.

Another object of the present invention is to provide a method for manufacturing a thin film transistor array substrate, and the method comprises the following steps: forming a plurality of gate electrodes on a transparent substrate; forming a gate insulating layer, a semiconductor layer, an ohmic contact layer, an electrode layer and a photo-resist layer on the transparent substrate and the gate electrodes in sequence; using a multi tone mask to pattern the photo-resist layer, so as to allow the photo-resist layer to have different thicknesses and channels, wherein the channels are formed above the gate electrodes; using the patterned photo-resist layer to act as a mask and performing a wet etching and a dry etching to etch the semiconductor layer, the ohmic contact layer and the electrode layer, so as to remove a portion of the semiconductor layer, a portion of the ohmic contact layer and a portion of the electrode layer, and to form a plurality of source electrodes and a plurality of drain electrodes at both sides of the channels, respectively; heating the photo-resist layer, so as to allow a portion of the photo-resist layer to reflow into the channels and to shelter the channels; using the photo-resist layer to act as another mask after reflowing, and performing another dry etching for the semiconductor layer, so as to remove a portion of the semiconductor layer; removing the photo-resist layer; forming a passivation layer on the channels, the source electrodes and the drain electrodes; and forming a pixel electrode layer on the passivation layer, wherein the pixel electrode layer is electrically connected to the drain electrodes.

Still another object of the present invention is to provide a method for manufacturing a display panel, and the method comprises the following steps: forming a plurality of gate electrodes on a transparent substrate; forming a gate insulating layer, a semiconductor layer, an ohmic contact layer, an electrode layer and a photo-resist layer on the transparent substrate and the gate electrodes in sequence; using a multi tone mask to pattern the photo-resist layer, so as to allow the photo-resist layer to have different thicknesses and channels, wherein the channels are formed above the gate electrodes; etching the semiconductor layer, the ohmic contact layer and the electrode layer, so as to remove a portion of the semiconductor layer, a portion of the ohmic contact layer and a portion of the electrode layer, and to form a plurality of source electrodes and a plurality of drain electrodes at both sides of the channels, respectively; heating the photo-resist layer, so as to allow a portion of the photo-resist layer to reflow into the channels and to shelter the channels; etching the semiconductor layer, so as to remove a portion of the semiconductor layer; removing the photo-resist layer; forming a passivation layer on the channels, the source electrodes and the drain electrodes; forming a pixel electrode layer on the passivation layer, wherein the pixel electrode layer is electrically connected to the drain electrodes, so as to achieve a thin film transistor array substrate; and forming a liquid crystal layer between the thin film transistor array substrate and a color filter substrate.

In one embodiment of the present invention, the multi tone mask is a gray tone mask (GTM), a stacked layer mask (SLM) or a half tone mask (HTM).

In one embodiment of the present invention, the multi tone mask includes a middle exposure region, partial exposure regions, non-exposure regions and full exposure regions, and the partial exposure regions are positioned at both sides of the middle exposure region, and the full exposure regions are positioned at the outside of the non-exposure regions.

In one embodiment of the present invention, the partial exposure regions have a plurality of regions with different transmittances.

In one embodiment of the present invention, the partial exposure regions have a plurality of regions with transmittances ranging from 20% to 80%.

In one embodiment of the present invention, the transmittance of one of the regions close to the middle exposure region is higher than the transmittance of another one of the regions far away the middle exposure region.

In one embodiment of the present invention, when etching the semiconductor layer, the ohmic contact layer and the electrode layer, the patterned photo-resist layer is used to act as a mask, a wet etching and a dry etching is performed to etch the semiconductor layer, the ohmic contact layer and the electrode layer.

In one embodiment of the present invention, when etching the semiconductor layer, the photo-resist layer after reflowing is used to act as a mask, and a dry etching is performed to etch the semiconductor layer.

In one embodiment of the present invention, when removing the photo-resist layer, the photo-resist layer is removed by lifting off.

The methods of the present invention for manufacturing the TFT array substrate and the display panel can reduce an amount of the required masks in the fabrication process, hence reducing the cost and time of the fabrication process. The method of the present invention can reduce the using of wet etching, thereby alleviating the effect of the wet etching on the elements of the TFT array substrate.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
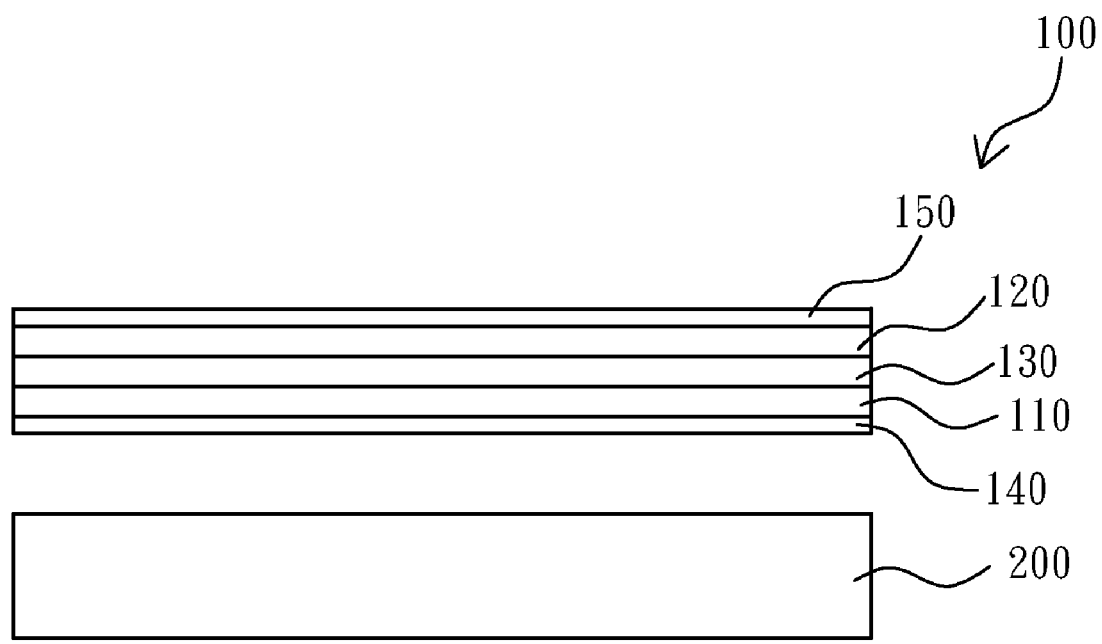
FIG. 1 is a cross-sectional view showing a display panel and a backlight module according to an embodiment of the present invention.
Figure 2A:
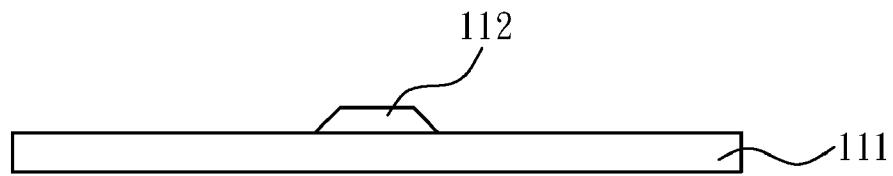
FIGS. 2A-2I are schematic flow diagrams showing a process for manufacturing a TFT array substrate according to an embodiment of the present invention.
Figure 2B:
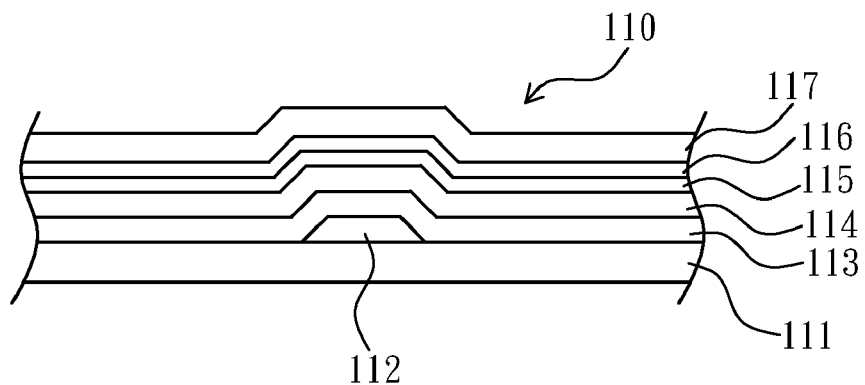
Figure 2C:
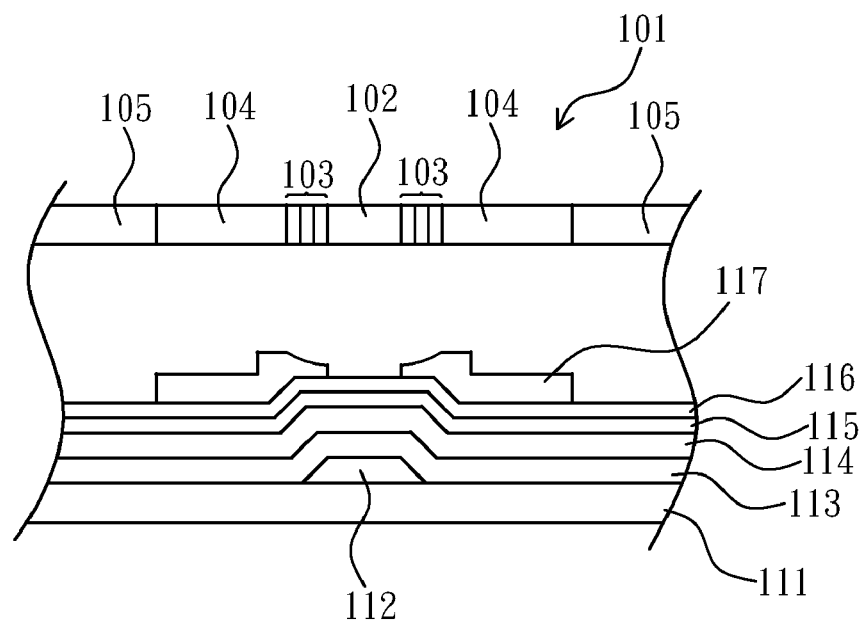
Figure 2D:
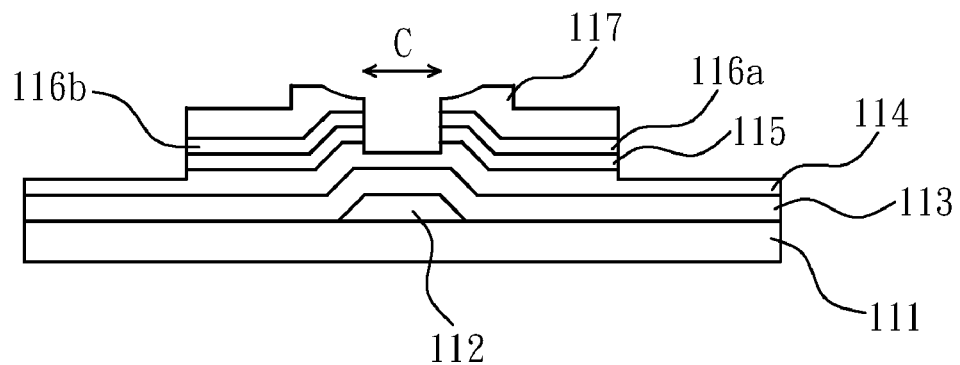
Figure 2E:
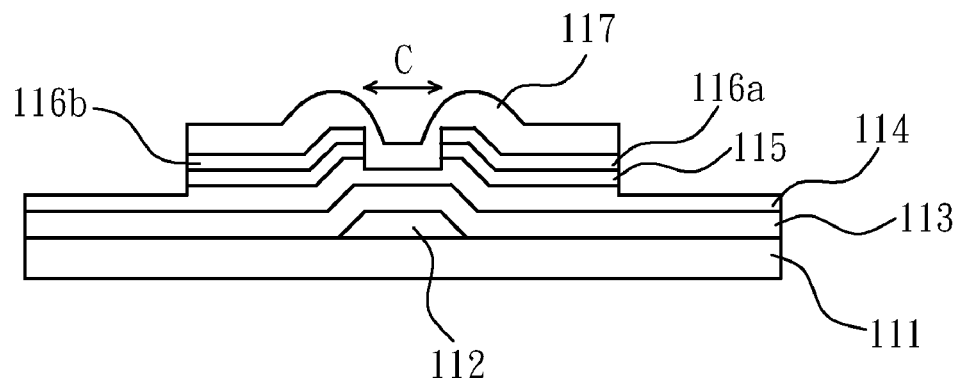
Figure 2F:
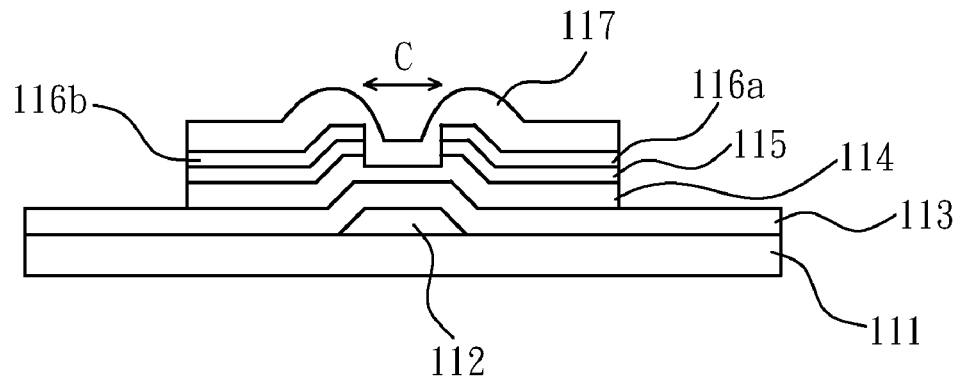
Figure 2G:
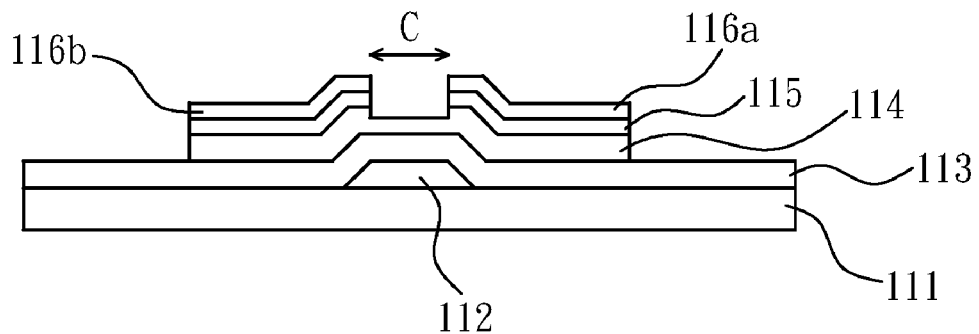
Figure 2H:
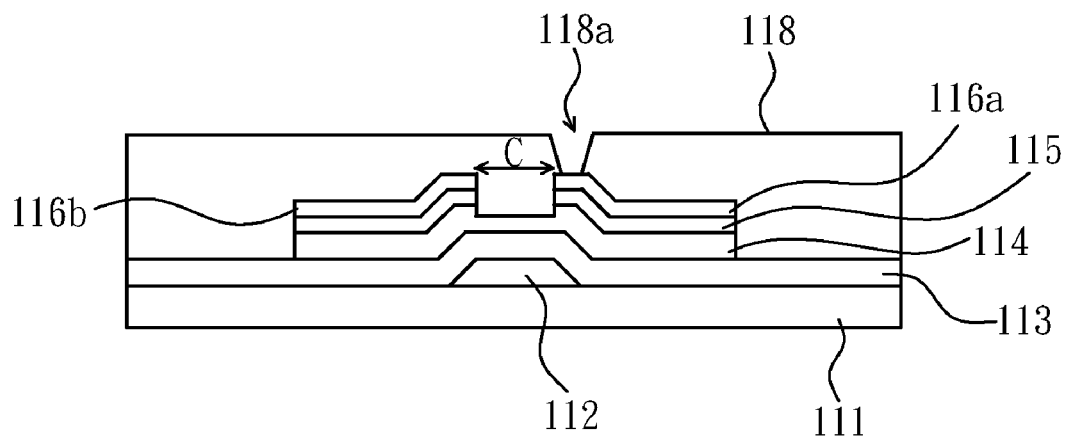
Figure 2I:
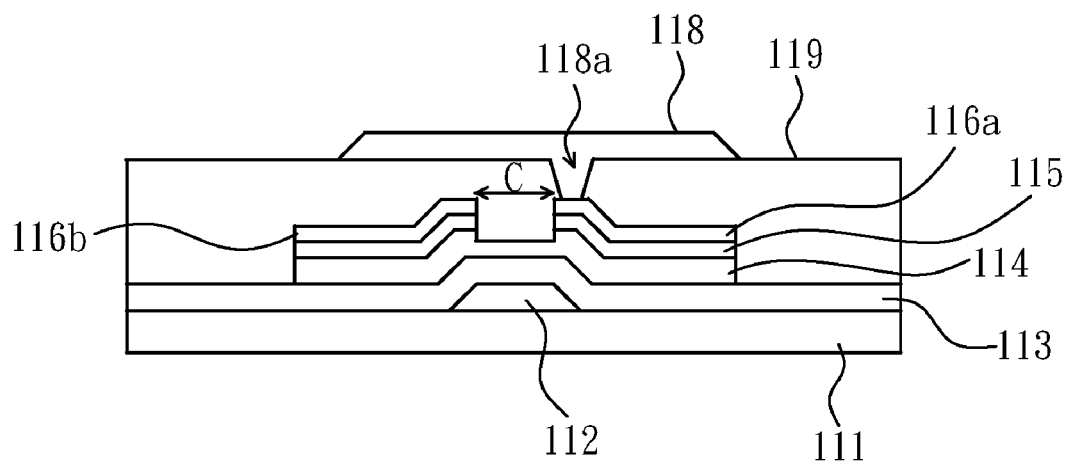

The following embodiments are referring to the accompanying drawings for exemplifying specific performable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, structure-like elements are labeled with like reference numerals.

Referring to FIG. 1, a cross-sectional view showing a display panel and a backlight module according to an embodiment of the present invention is illustrated. The method of the present embodiment for manufacturing a TFT array substrate can be applicable to the fabrication of the display panel 100, such as a liquid crystal display panel. When utilizing the display panel 100 of the present embodiment to fabricate a display apparatus, the display panel 100 may be disposed on the backlight module 200, thereby forming a liquid crystal display apparatus. The display panel 100 may comprise a first substrate 110, a second substrate 120, a liquid crystal layer 130, a first polarizer 140 and a second polarizer 150. The first substrate 110 and the second substrate 120 may be realized as glass substrates or flexible plastic substrates. In this embodiment, the first substrate 110 may be, for example, a TFT array substrate, and the second substrate 120 may be, for example, a color filter (CF) substrate. It notes that the CF and the TFT array may also be disposed on the same substrate in other embodiments.

Referring to FIG. 1 again, the liquid crystal layer 130 is formed between the first substrate 110 and the second substrate 120. The first polarizer 140 is disposed on one side of the first substrate 110 and opposite to the liquid crystal layer 130 (as a light-incident side). The second polarizer 150 is disposed on one side of the second substrate 120 and opposite to the liquid crystal layer 130 (as a light-emitting side).

Referring to FIG. 2A through FIG. 2I, schematic flow diagrams showing a process for manufacturing a TFT array substrate according to an embodiment of the present invention are illustrated. When manufacturing the TFT array substrate (such as the first substrate 110) of the present embodiment, referring to FIG. 2A, firstly, a plurality of gate electrodes 112 are formed on a transparent substrate 111. The transparent substrate 111 may be a quartz or glass substrate. The gate electrodes 112 can be formed by a photolithography process (a first mask process). The material of the gate electrodes 112 may be Al, Ag, Cu, Mo, Cr, W, Ta, Ti, metal nitride or any alloys thereof.

Furthermore, the metallic layer of the gate electrodes 112 may be a multi-layer structure with heat-resistant film and lower resistance film, such as dual-layer structure with molybdenum nitride film and Al film.

Subsequently, referring to FIG. 2B again, a gate insulating layer 113, a semiconductor layer 114, an ohmic contact layer 115, an electrode layer 116 and a photo-resist layer 117 are formed on the transparent substrate 111 and the gate electrodes 112 in sequence. The material of the gate insulating layer 113 may be silicon nitride ($SiN_x$) or silicon oxide ($SiO_x$) which may be formed with a plasma enhanced chemical vapor deposition (PECVD) method. The semiconductor layer 114 is preferably made of amorphous silicon (a-Si) or polycrystalline silicon. In this embodiment, for forming the semiconductor layer 114, an a-Si layer can be first deposited, and then a rapid thermal annealing step is performed to the a-Si layer, thereby allowing the a-Si layer to recrystallize into a polycrystalline silicon layer. The material of the ohmic contact layer 115 is preferably made of N+ a-Si (or silicide) heavily doped with N dopant (such as phosphorous) using such as ion implantation or chemical vapor deposition method. The material of the electrode layer 116 may be Mo, Cr, Ta, Ti or alloys thereof.

Subsequently, referring to FIG. 2C again, a multi tone mask 101 is used to pattern the photo-resist layer 117 (a second mask process), so as to allow the photo-resist layer 117 to have different thicknesses and channels C, wherein the channels C are formed above the gate electrodes 112 to expose a surface of the electrode layer 116. The multi tone mask 101 may be a gray tone mask (GTM), a stacked layer mask (SLM) or a half tone mask (HTM). In this embodiment, the multi tone mask 101 can include a middle exposure region 102, partial exposure regions 103, non-exposure regions 104 and full exposure regions 105. The middle exposure region 102 is positioned above the gate electrodes 112 for allowing light to pass completely. The partial exposure regions 103 are positioned at both sides of the middle exposure region 102 for allowing light to pass partially. In this embodiment, the partial exposure regions 103 can have a plurality of regions with different transmittances ranging from 20% to 80%, such as 40%, 50% and 60%. In this case, the transmittance of one of the regions of the partial exposure regions 103 close to the middle exposure region 102 is higher than the transmittance of another one of the regions thereof far away the middle exposure region 102. The full exposure regions 105 are positioned at the outside of the non-exposure regions 104 for allowing light to pass completely. After using the multi tone mask 101 to perform the photolithography process, the patterned photo-resist layer 117 can have different thicknesses, and a portion of the photo-resist layer 117 which is position above the gate electrodes 112 is removed, so as to form the channels C.

Subsequently, referring to FIG. 2D again, the semiconductor layer 114, the ohmic contact layer 115 and the electrode layer 116 are etched, so as to remove a portion of the semiconductor layer 114, a portion of the ohmic contact layer 115 and a portion of the electrode layer 116, and to form a plurality of source electrodes 116b and a plurality of drain electrodes 116a at both sides of the channels C, respectively. At this time, the patterned photo-resist layer 117 can be used to act as a mask, and a wet etching and a dry etching are performed to etch the semiconductor layer 114, the ohmic contact layer 115 and the electrode layer 116, so as to remove the portions (especially the portions positioned in the channels) of the semiconductor layer 114, the ohmic contact layer 115 and the electrode layer 116 which are not sheltered by the photo-resist layer 117.

Subsequently, referring to FIG. 2E again, the photo-resist layer is heated, so as to allow a portion of the photo-resist layer 117 to reflow into the channels C for sheltering the channels C. When heating the photo-resist layer 117, the portions of the photo-resist layer 117 close to the channels C are in a melting state and thus reflow into the channels C for sheltering the channels C.

Subsequently, referring to FIG. 2F again, the semiconductor layer 114 is etched to remove a portion of the semiconductor layer 114. At this time, after reflowing, the photo-resist layer 117 can be used to act as a mask, and another dry etching is performed to etch the semiconductor layer 114, so as to remove the portion of the semiconductor layer 114 which is not sheltered by the photo-resist layer 117 for patterning the semiconductor layer 114, wherein the patterned semiconductor layer 114 can be acted as semiconductor islands of the TFTs. Subsequently, referring to FIG. 2G again, the photo-resist layer 117 is removed by lifting off the photo-resist layer 117.

Subsequently, referring to FIG. 2H again, a passivation layer 118 is formed on the channels C, the source electrodes 116b and the drain electrodes 116a (a third mask process), wherein the passivation layer 118 includes at least one contact hole 118a to expose a portion of the drain electrodes 116a. In this case, the passivation layer 118 can be formed by a PECVD apparatus.

Subsequently, referring to FIG. 2I again, a transparent and electrically conductive layer (such as ITO, IZO, AZO, GZO, TCO or ZnO) is first formed on the passivation layer 118, and then the transparent and electrically conductive layer is patterned to form a pixel electrode layer 119 with using photolithography (a fourth mask process). The pixel electrode layer 119 covers the contact hole 118a of the passivation layer 118, and thus the electrode layer 119 can be electrically connected to the drain electrodes 116a through the contact hole 118a, thereby forming the TFT array substrate 110 of the present embodiment.

As described above, the methods of the present invention for manufacturing the TFT array substrate and the display panel can use only four masks to manufacture the TFT array substrate for reducing an amount of the required masks in the fabrication process, hence reducing the cost and time of the fabrication process. Furthermore, in the second mask process, only one wet etching is required, hence alleviating the effect of the wet etching on the elements of the TFT array substrate.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A method for manufacturing a thin film transistor array substrate, comprising the following steps:
   forming a plurality of gate electrodes on a transparent substrate;
   forming a gate insulating layer, a semiconductor layer, an ohmic contact layer, an electrode layer and a photo-resist layer on the transparent substrate and the gate electrodes in sequence;
   using a multi tone mask to pattern the photo-resist layer, so as to allow the photo-resist layer to have different thicknesses and channels, wherein the channels are formed above the gate electrodes;
   using the patterned photo-resist layer to act as a mask and performing a wet etching and a dry etching to etch the semiconductor layer, the ohmic contact layer and the electrode layer, so as to remove a portion of the semiconductor layer, a portion of the ohmic contact layer and a portion of the electrode layer, and to form a plurality of source electrodes and a plurality of drain electrodes at both sides of the channels, respectively;
   heating the photo-resist layer, so as to allow a portion of the photo-resist layer to reflow into the channels and to shelter the channels;
   using the photo-resist layer to act as another mask after reflowing, and performing another dry etching for the semiconductor layer, so as to remove a portion of the semiconductor layer;
   removing the photo-resist layer;
   forming a passivation layer on the channels, the source electrodes and the drain electrodes; and
   forming a pixel electrode layer on the passivation layer, wherein the pixel electrode layer is electrically connected to the drain electrodes.

2. A method for manufacturing a thin film transistor array substrate, comprising the following steps:
   forming a plurality of gate electrodes on a transparent substrate;
   forming a gate insulating layer, a semiconductor layer, an ohmic contact layer, an electrode layer and a photo-resist layer on the transparent substrate and the gate electrodes in sequence;
   using a multi tone mask to pattern the photo-resist layer, so as to allow the photo-resist layer to have different thicknesses and channels, wherein the channels are formed above the gate electrodes;
   etching the semiconductor layer, the ohmic contact layer and the electrode layer, so as to remove a portion of the semiconductor layer, a portion of the ohmic contact layer and a portion of the electrode layer, and to form a plurality of source electrodes and a plurality of drain electrodes at both sides of the channels, respectively;
   heating the photo-resist layer, so as to allow a portion of the photo-resist layer to reflow into the channels and to shelter the channels;

etching the semiconductor layer, so as to remove a portion of the semiconductor layer;

removing the photo-resist layer;

forming a passivation layer on the channels, the source electrodes and the drain electrodes; and forming a pixel electrode layer on the passivation layer, wherein the pixel electrode layer is electrically connected to the drain electrodes.

3. The method according to claim 2, wherein the multi tone mask is a gray tone mask (GTM), a stacked layer mask (SLM) or a half tone mask (HTM).

4. The method according to claim 2, wherein the multi tone mask includes a middle exposure region, partial exposure regions, non-exposure regions and full exposure regions, and the partial exposure regions are positioned at both sides of the middle exposure region, and the full exposure regions are positioned at the outside of the non-exposure regions.

5. The method according to claim 4, wherein the partial exposure regions have a plurality of regions with different transmittances.

6. The method according to claim 4, wherein the partial exposure regions have a plurality of regions with transmittances ranging from 20% to 80%.

7. The method according to claim 6, wherein the transmittance of one of the regions close to the middle exposure region is higher than the transmittance of another one of the regions far away the middle exposure region.

8. The method according to claim 2, wherein, when etching the semiconductor layer, the ohmic contact layer and the electrode layer, the patterned photo-resist layer is used to act as a mask, a wet etching and a dry etching is performed to etch the semiconductor layer, the ohmic contact layer and the electrode layer.

9. The method according to claim 2, wherein, when etching the semiconductor layer, the photo-resist layer after reflowing is used to act as a mask, and a dry etching is performed to etch the semiconductor layer.

10. The method according to claim 2, wherein, when removing the photo-resist layer, the photo-resist layer is removed by lifting off.

11. A method for manufacturing a display panel, comprising the following steps:

forming a plurality of gate electrodes on a transparent substrate;

forming a gate insulating layer, a semiconductor layer, an ohmic contact layer, an electrode layer and a photo-resist layer on the transparent substrate and the gate electrodes in sequence;

using a multi tone mask to pattern the photo-resist layer, so as to allow the photo-resist layer to have different thicknesses and channels, wherein the channels are formed above the gate electrodes;

etching the semiconductor layer, the ohmic contact layer and the electrode layer, so as to remove a portion of the semiconductor layer, a portion of the ohmic contact layer and a portion of the electrode layer, and to form a plurality of source electrodes and a plurality of drain electrodes at both sides of the channels, respectively;

heating the photo-resist layer, so as to allow a portion of the photo-resist layer to reflow into the channels and to shelter the channels;

etching the semiconductor layer, so as to remove a portion of the semiconductor layer;

removing the photo-resist layer;

forming a passivation layer on the channels, the source electrodes and the drain electrodes;

forming a pixel electrode layer on the passivation layer, wherein the pixel electrode layer is electrically connected to the drain electrodes, so as to achieve a thin film transistor array substrate; and forming a liquid crystal layer between the thin film transistor array substrate and a color filter substrate.

12. The method according to claim 11, wherein the multi tone mask is a gray tone mask (GTM), a stacked layer mask (SLM) or a half tone mask (HTM).

13. The method according to claim 11, wherein the multi tone mask includes a middle exposure region, partial exposure regions, non-exposure regions and full exposure regions, and the partial exposure regions are positioned at both sides of the middle exposure region, and the full exposure regions are positioned at the outside of the non-exposure regions.

14. The method according to claim 13, wherein the partial exposure regions have a plurality of regions with different transmittances.

15. The method according to claim 13, wherein the partial exposure regions have a plurality of regions with transmittances ranging from 20% to 80%.

16. The method according to claim 15, wherein the transmittance of one of the regions close to the middle exposure region is higher than the transmittance of another one of the regions far away the middle exposure region.

17. The method according to claim 11, wherein, when etching the semiconductor layer, the ohmic contact layer and the electrode layer, the patterned photo-resist layer is used to act as a mask, a wet etching and a dry etching is performed to etch the semiconductor layer, the ohmic contact layer and the electrode layer.

18. The method according to claim 11, wherein, when etching the semiconductor layer, the photo-resist layer after reflowing is used to act as a mask, and a dry etching is performed to etch the semiconductor layer.

19. The method according to claim 11, wherein, when removing the photo-resist layer, the photo-resist layer is removed by lifting off.

\* \* \* \* \*